US008847932B2

(12) United States Patent
Kang et al.

(10) Patent No.: US 8,847,932 B2
(45) Date of Patent: Sep. 30, 2014

(54) ORGANIC LIGHT EMITTING DIODE DISPLAY

(75) Inventors: Ki-Nyeng Kang, Yongin (KR); Yong-Sung Park, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 328 days.

(21) Appl. No.: 13/306,463

(22) Filed: Nov. 29, 2011

(65) Prior Publication Data

US 2012/0176348 A1 Jul. 12, 2012

(30) Foreign Application Priority Data

Jan. 10, 2011 (KR) .......................... 10-2011-0002383

(51) Int. Cl.
  *G06F 3/038* (2013.01)
  *G09G 3/32* (2006.01)
  *H01L 27/32* (2006.01)

(52) U.S. Cl.
  CPC ......... *H01L 27/3276* (2013.01); *H01L 27/3246* (2013.01); *G09G 2300/0426* (2013.01); *G09G 3/3208* (2013.01)
  USPC .......................................... 345/204; 345/205

(58) Field of Classification Search
  CPC . G09G 3/3655; G09G 3/3696; G09G 3/3674; G09G 3/3685

USPC ............................................ 345/204–214, 55
See application file for complete search history.

(56) References Cited

U.S. PATENT DOCUMENTS

| 7,208,873 | B2 * | 4/2007 | Jeong ............................ 313/512 |
| 7,777,713 | B2 * | 8/2010 | Hashimoto et al. ........... 345/100 |
| 7,965,272 | B2 * | 6/2011 | Eom ............................... 345/98 |
| 2006/0248421 | A1 * | 11/2006 | Choi ............................. 714/731 |

FOREIGN PATENT DOCUMENTS

| KR | 10-0700653 | | 3/2007 |
| KR | 10-0712110 | | 4/2007 |
| KR | 1020100011900 | * | 6/2009 |
| KR | 10-2010-0011900 | | 2/2010 |

* cited by examiner

*Primary Examiner* — Andrew Sasinowski
(74) *Attorney, Agent, or Firm* — Robert E. Bushnell, Esq.

(57) ABSTRACT

An organic light emitting diode display comprises: a panel including a first substrate and a second substrate facing each other; a data driver connected to a data line formed on the panel; a gate driver connected to a gate line crossing the data line in an insulated manner and formed on the panel; an input line for receiving a clock signal from the an external source; a first connecting line formed on the first substrate and electrically connected to the input line for supplying the clock signal to the gate driver; a second connecting line formed on the second substrate and electrically connected to the input line; and a third connecting line for electrically connecting the first connecting line to the second connecting line.

15 Claims, 5 Drawing Sheets

ORGANIC LIGHT EMITTING DIODE DISPLAY

CLAIM OF PRIORITY

This application makes reference to, incorporates the same herein, and claims all benefits accruing under 35 U.S.C. §119 from an application earlier filed in the Korean Intellectual Property Office on the 10 of Jan. 2011 and there duly assigned Serial No. 10-2011-0002383.

BACKGROUND OF THE INVENTION

1. Field of the Invention

The present invention relates generally to an organic light emitting diode (OLED) display. More particularly, the present invention relates to an organic light emitting diode (OLED) display including a gate driver.

2. Description of the Related Art

Display devices display images and, among them, the organic light emitting diode (OLED) display has been in the spotlight.

The OLED display has a self luminance characteristic and, unlike a liquid crystal display (LCD) device, it does not require a separate light source. Thus, it can have reduced thickness and weight. Furthermore, the OLED display represents high quality characteristics of low power consumption, high luminance, and a high reaction speed.

However, organic light emitting diode (OLED) displays have certain problems. Among these problems are delay of a clock signal provided to an input line. Attempts to solve this problem have included the provision of multiple flexible printed circuits (FPCs). However, this attempted solution increases production cost, and thus deteriorates production yield.

The above information disclosed in this Background section is only for enhancement of understanding of the background of the described technology, and therefore it may contain information which does not form the prior art which is already known in this country to a person of ordinary skill in the art.

SUMMARY OF THE INVENTION

The present invention has been developed in an effort to provide an organic light emitting diode (OLED) display for minimizing delay of a clock signal, reducing production cost, and improving production yield.

An exemplary embodiment of the present invention provides an organic light emitting diode display comprising: a panel including a first substrate and a second substrate facing each other; a data driver connected to a data line formed on the panel; a gate driver connected to a gate line crossing the data line in an insulated manner so as to be formed on the panel; an input line for receiving a clock signal from the outside; a first connecting line formed on the first substrate and electrically connected to the input line so as to supply the clock signal to the gate driver; a second connecting line formed on the second substrate and electrically connected to the input line; and a third connecting line for electrically connecting the first connecting line and the second connecting line.

The organic light emitting diode display further comprises: a first electrode provided on the first substrate; an organic emission layer provided on the first electrode; and a second electrode provided on the organic emission layer; wherein the first connecting line is overlapped on the second electrode. The second connecting line does not overlap with respect to the second electrode.

The gate line includes a gate transparent layer and a gate metal layer formed on the gate transparent layer, and the first electrode is formed on the same layer as, and with the same material as, the gate transparent layer.

The first connecting line is formed on the same layer as, and with the same material as, the data line.

The third connecting line includes: a sub-connecting line formed on the same layer as, and with the same material as, the gate line; and an access unit for connecting the sub-connecting line and the second connecting line.

The data line is provided on the gate line, and further includes: a first insulation layer provided on the gate line; and a second insulation layer provided on the data line and including an organic material; wherein the second connecting line faces the first insulation layer.

The second insulation layer is not provided between the second connecting line and the first insulation layer.

According to the embodiment, an organic light emitting diode (OLED) display for minimizing clock signal delay, reducing production cost, and improving production yield is provided.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
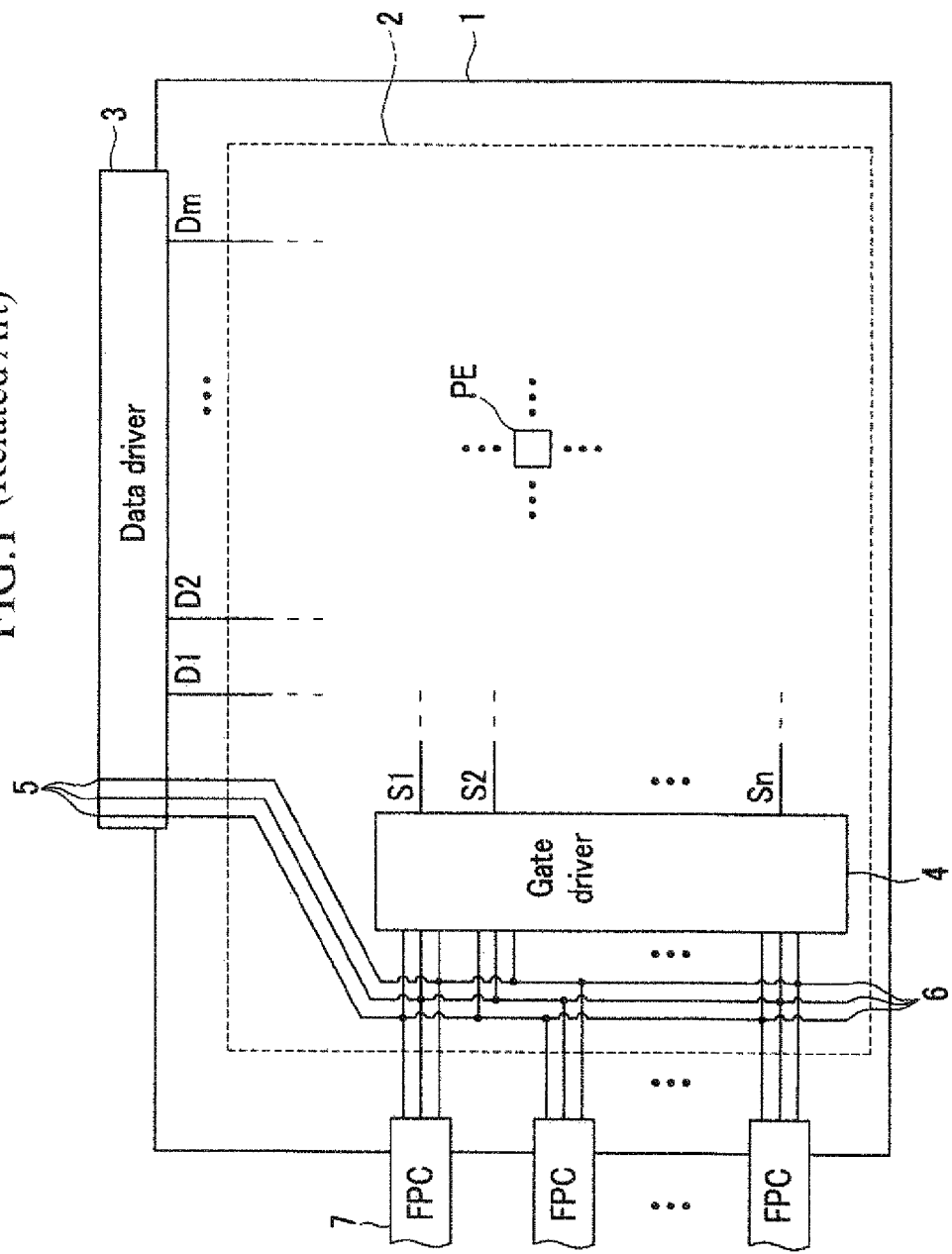
FIG. 1 shows an organic light emitting diode (OLED) display.

The present invention will be described more fully hereinafter with reference to the accompanying drawings, in which exemplary embodiments of the invention are shown. As those skilled in the art will realize, the described embodiments may be modified in various different ways, all without departing from the spirit or scope of the present invention.

The drawings and description are to be regarded as illustrative in nature and not restrictive. Like reference numerals designate like elements throughout the specification.

In addition, the size and thickness of each component shown in the drawings are arbitrarily shown for understanding and ease of description, and the present invention is not limited thereto.

In the drawings, the thickness of layers, films, panels, regions, etc. are exaggerated for clarity. In the drawings, for understanding and ease of description, the thicknesses of some layers and areas are exaggerated. It will be understood that, when an element such as a layer, film, region, or substrate is referred to as being "on" another element, it can be directly on the other element or intervening elements may also be present. In addition, unless explicitly described to the contrary, the word "comprise" and variations such as "comprises" or "comprising" will be understood to imply the inclusion of stated elements but not the exclusion of any other elements. In addition, throughout the specification, the term "on" indicates that an element is either positioned on or below a portion of a target, or is positioned on the upper side based on a gravity direction.

FIG. 1 shows an organic light emitting diode (OLED) display.

As shown in FIG. 1, the organic light emitting diode (OLED) display includes a panel 1, a data driver 3, a gate driver 4, and a pixel (PE).

The pixel (PE) is formed at a crossing region of gate lines (S1 to Sn) and data lines (D1 to Dm). Although not shown, drive power lines can be formed to face the data lines (D1 to Dm). The pixel (PE) is selected to charge a voltage corresponding to a data signal when a gate signal is provided, and it emits light with predetermined luminance in correspondence with the charged voltage.

The data driver 3 supplies a data signal to the data lines (D1 to Dm) when a gate signal is provided from the gate driver 4.

The gate driver 4 sequentially supplies a gate signal to the gate lines (S1 to Sn). In this regard, the gate driver 4 is formed so as to be installed on the panel 1 when the pixel (PE) is formed. For this purpose, the gate driver 4 includes an input line 5, and a connecting line 6 provided between the input line 5 and the gate driver 4.

The input line 5 receives a clock signal from a flexible printed circuit (FPC) (not shown). The connecting line 6 is electrically connected to the input line 5, is formed in parallel with the data lines (D1 to Dm), and supplies the clock signal to a stage (not shown) included in the gate driver 4.

The connecting line 6 formed on the panel 1 is provided so as to overlap with respect to the cathode 2. When the cathode 2 overlaps with respect to the connecting line 6, the connecting line 6 and the cathode 2 form a capacitor so as to delay the clock signal. In order to overcome such a problem, a plurality of flexible printed circuits (FPCs) 7 are installed with predetermined intervals so as to be connected to the panel 1, and the clock signal is additionally provided to the connecting line 6 by using the FPCs. However, this increases the production cost, and thus deteriorates the production yield.

An organic light emitting diode (OLED) display according to an exemplary embodiment of the invention will now be described with reference to FIG. 2 thru FIG. 5.

Figure 2:
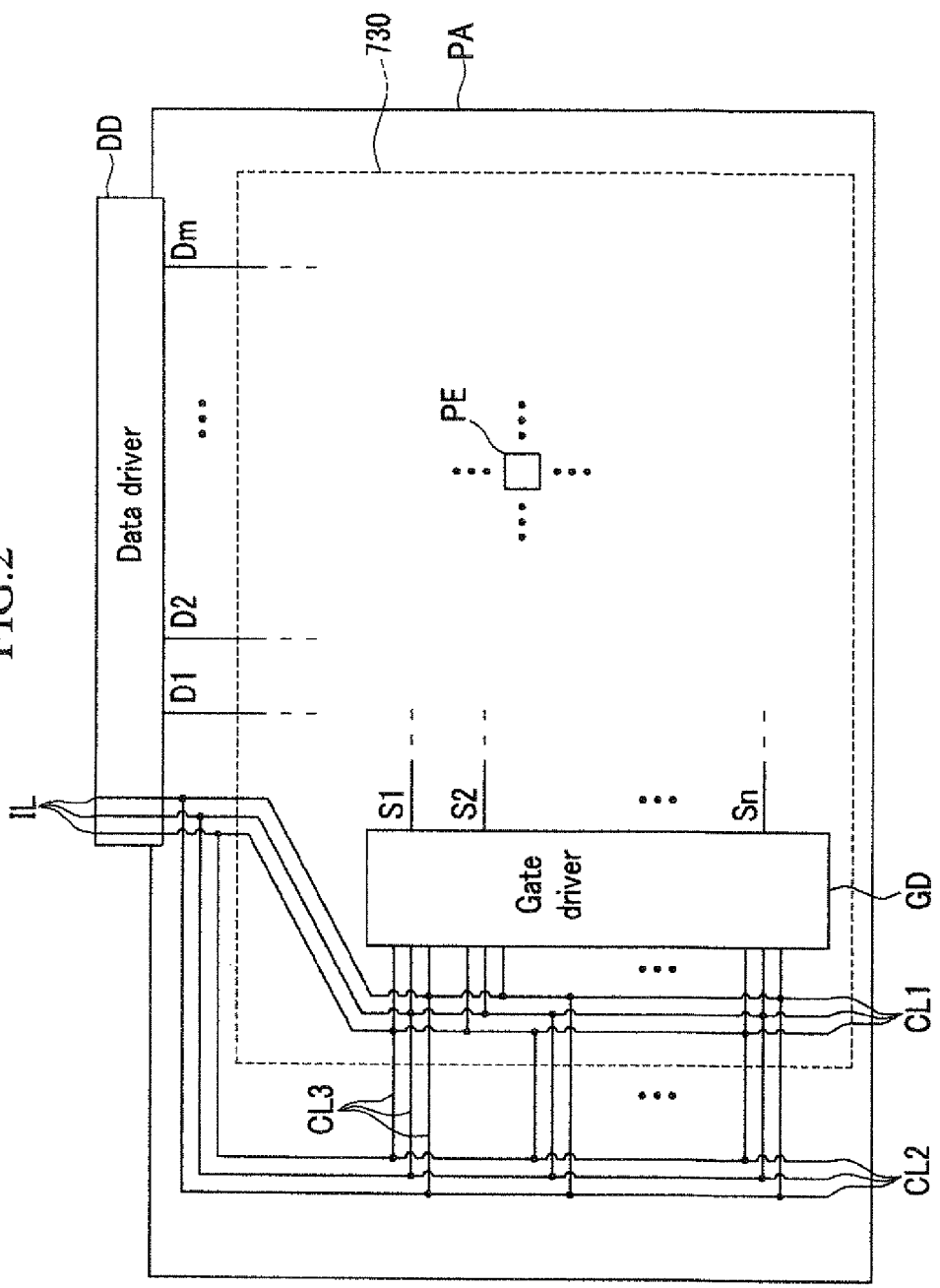
FIG. 2 shows an organic light emitting diode (OLED) display according to an exemplary embodiment of the present invention.

FIG. 2 shows an organic light emitting diode (OLED) display according to an exemplary embodiment of the present invention.

As shown in FIG. 2, the organic light emitting diode (OLED) display comprises a panel (PA), a data driver (DD), a gate driver (GD), and a pixel (PE). Here, the pixel (PE) represents the minimum unit for displaying the image, and the organic light emitting diode (OLED) display displays the images through a plurality of pixels (PEs).

The pixel (PE) is formed at a crossing region of the gate lines (S1 to Sn) and the data lines (D1 to Dm). Although not shown in FIG. 2, a drive power line can be formed to face the data lines (D1 to Dm). The pixel (PE) is selected to charge the voltage corresponding to the data signal when the gate signal is supplied, and it emits light with predetermined luminance in corresponding to the charged voltage. A detailed description of the pixel (PE) will be provided later.

The data driver (DD) supplies the data signal to the data lines (D1 to Dm) when the gate signal is provided by the gate driver (GD). The data driver (DD) is configured with a plurality of data integrated circuits (not shown). The data integrated circuits respectively include j (j is a natural number) channels so as to supply j data signals.

The gate driver (GD) sequentially supplies the gate signal to the gate lines (S1 to Sn). The gate driver (GD) can be installed on the panel (PA) when the pixel (PE) is formed. The gate driver (GD) installed on the panel (PA) receives a clock signal from an external device. For this purpose, an input line IL, a first connecting line CL1, a second connecting line CL2, and a third connecting line CL3 are formed on the panel (PA).

The input line IL receives the clock signal from a flexible printed circuit (FPC) (not shown) through a channel of the data integrated circuit included in the data driver (DD). In detail, some channels from among the data integrated circuits configured with j channels are not used. The input line IL receives the clock signal from the flexible printed circuit (FPC) through the unused channels.

The first connecting line CL1 is formed in parallel with the gate driver (GD), and is electrically connected to the input line IL. The first connecting line CL1 supplies the clock signal provided by the input line (IL) to the gate driver (GD). In detail, the gate driver (GD) includes n stages respectively connected to the gate lines (S1 to Sn). The first connecting line CL1 supplies the clock signal to the stages so that the gate signal may be generated in each stage.

The first connecting line CL1 is electrically connected to the stage forming the gate driver (GD) so that it is formed near the gate driver (GD). In this case, the first connecting line CL1 provided near the gate driver (GD) overlap with a second electrode 730, a cathode to be described later.

The second connecting line CL2 is formed in parallel with the gate driver (GD), and is electrically connected to the input line (IL). The second connecting line CL2 is electrically connected to the first connecting line CL1 through the third connecting line CL3. The third connecting line CL3 can electrically connect the second connecting line CL2 for receiving a specific clock signal and the first connecting line CL1 for receiving the specific clock signal at a plurality of nodes. When the second connecting line CL2 and the first connecting line CL1 receiving the same clock signal are electrically connected, resistance of the first connecting line CL1 is reduced so as to minimize the delay of the clock signal.

In particular, the second connecting line CL2 does not overlap with the second electrode 730, a cathode. In this case, the second connecting line CL2 does not form a capacitor with the second electrode 730 so that the clock signal is not delayed. Therefore, the first connecting line CL1 for receiving the clock signal at a plurality of nodes through the second connecting line CL2 minimizes the delay of the clock signal.

A detailed stacked state of the first connecting line CL1, the second connecting line CL2, and the third connecting line CL3 will be described later.

Figure 3:
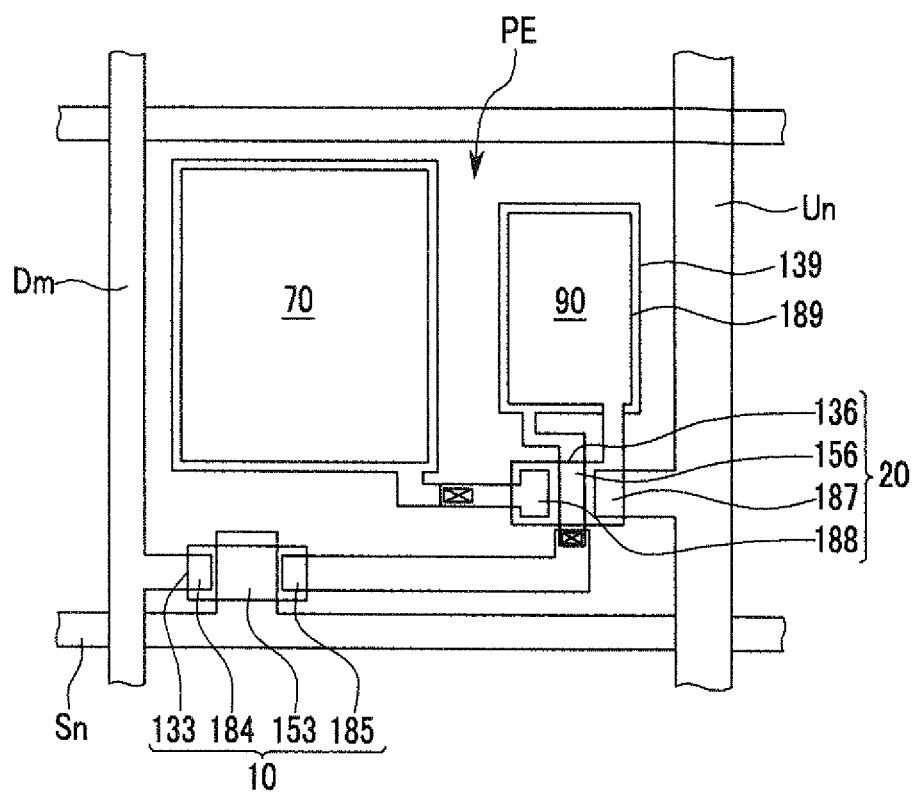
FIG. 3 shows a layout view of a pixel of the organic light emitting diode (OLED) display shown in FIG. 2.

Referring to FIG. 3, a disposal of a pixel (PE) will be described in detail.

FIG. 3 shows a layout view of a pixel of the organic light emitting diode (OLED) display shown in FIG. 2.

As shown in FIG. 3, the pixel (PE) includes an organic light emitting diode 70, a plurality of thin film transistors (TFTs) 10 and 20, and a capacitor 90 in the 2Tr-1Cap structured organic light emitting diode (OLED) display. However, the exemplary embodiment is not limited thereto. Therefore, the display device can be an organic light emitting diode (OLED) display including at least three thin film transistors and at least two capacitors for each pixel (PE). Also, the display device can be formed so as to have various configurations with an additional wire formed. Accordingly, at least one additionally formed thin film transistor and capacitor can be an element of a compensation circuit. The compensation circuit improves uniformity of the organic light emitting diode 70 formed for each pixel (PE) so as to control generation of deviation of image quality. In general, the compensation circuit can include 2 to 8 thin film transistors.

The organic light emitting diode 70 includes a first electrode, an anode functioning as a hole injection electrode, a second electrode, a cathode functioning as an electron injection electrode, and an organic emission layer disposed between the first electrode and the second electrode.

In detail, the organic light emitting diode (OLED) display includes a first thin film transistor 10 and a second thin film transistor 20 formed for each pixel (PE). The first thin film transistor 10 and the second thin film transistor 20 include gate electrodes 153 and 156, respectively, semiconductor layers 133 and 136, respectively, source electrodes 184 and 187, respectively, and drain electrodes 185 and 188, respectively.

Also, a gate line (Sn), a data line (Dm), and a common power line (Un) are formed on the panel (PA). The pixel (PE) is defined by the gate line (Sn), the data line (Dm), and the common power line (Un). However, the pixel (PE) is not limited thereto. Furthermore, a capacitor line can be additionally formed on the panel (PA).

The data line Dm is connected to the source electrode 184 of the first thin film transistor 10, and the gate line (Sn) is connected to the gate electrode 153 of the first thin film transistor 10. A node is formed between the drain electrode 185 of the first thin film transistor 10 and the capacitor 90, and the drain electrode 185 of the first thin film transistor 10 is connected to a first capacitor electrode 139 of the capacitor 90. Furthermore, the drain electrode 185 of the first thin film transistor 10 is connected to the gate electrode 156 of the second thin film transistor 20. The source electrode 187 of the second thin film transistor 20 is connected to the common power line (Un), and the drain electrode 188 of the second thin film transistor 20 is connected to the first electrode, the anode of the organic light emitting element 70.

The first thin film transistor 10 is used as a switch for selecting a pixel (PE) to emit light. When the first thin film transistor 10 is turned on, the capacitor 90 is charged in proportion to the voltage applied from the data line Dm. While the first thin film transistor 10 is turned off, a gate potential of the second thin film transistor 20 increases according to the potential charged in the capacitor 90. The second thin film transistor 20 is turned on when the gate potential exceeds a threshold voltage. The voltage applied to the common power line (Un) is applied to the organic light emitting element 70 through the second thin film transistor 20, and the organic light emitting element 70 emits light.

The above-noted configuration of the pixel (PE) is not restricted to the description, and is variable in many ways within a range easily modifiable by a person skilled in the art.

Figure 4:
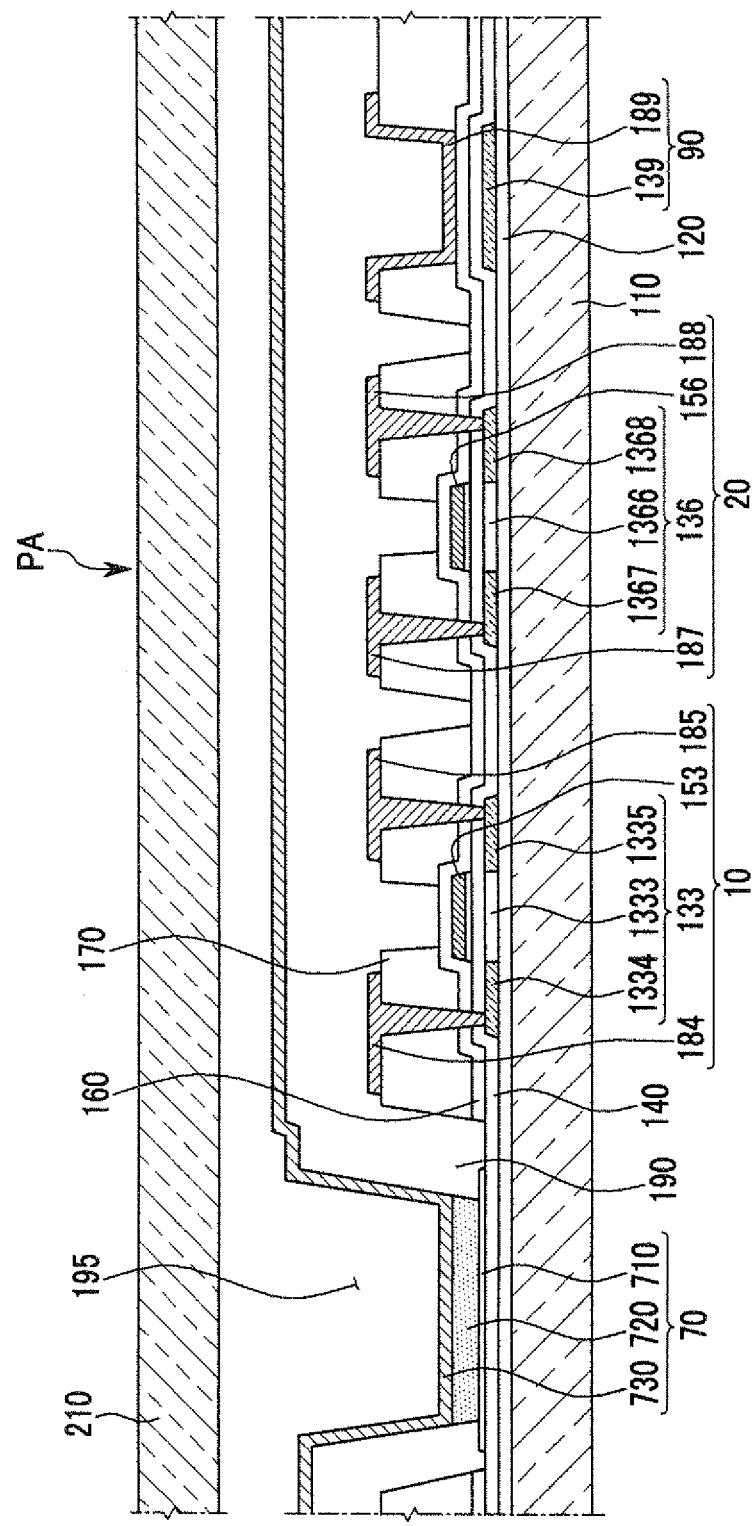
FIG. 4 shows a partially magnified cross-sectional view with respect to a thin film transistor, a capacitor, and an organic light emitting element shown in FIG. 3.

Referring to FIG. 4, a configuration of thin film transistors 10 and 20, the organic light emitting element 70, and the capacitor 90 according to an exemplary embodiment will be described in detail in the stacked sequence.

FIG. 4 shows a partially magnified cross-sectional view with respect to a thin film transistor, a capacitor, and an organic light emitting element shown in FIG. 3.

The panel (PA) includes a first substrate 110 and a second substrate 210 facing each other. At least one of the first substrate 110 and the second substrate 210 is formed as an insulating substrate made of glass, quartz, ceramic, or plastic. However, the exemplary embodiment is not restricted thereto, and the first substrate 110 and the second substrate 210 can be formed as a metallic substrate made of stainless steel. Also, when the first substrate 110 and the second substrate 210 are made of plastic, the panel (PA) can be formed so as to be flexible.

A buffer layer 120 is formed on the first substrate 110. The buffer layer 120 is formed as a single layer or a multi-layer, including at least one of insulating layers such as a silicon oxide layer or a silicon nitride layer, using a chemical vapor deposition method or a physical vapor deposition method.

The buffer layer 120 prevents diffusion or penetration of moisture or impurities generated from the substrate 110, smoothes the surface, and controls the transmission speed of heat during a crystallization process for forming a semiconductor layer.

The buffer layer 120 can be omitted depending on the type of the first substrate 110 and process conditions.

Semiconductor layers 133 and 136 and a first capacitor electrode 139 are formed on the buffer layer 120. The semiconductor layers 133 and 136 and the first capacitor electrode 139 are formed by disposing an amorphous silicon layer on the buffer layer 120, crystallizing it to form a polysilicon layer, and patterning the same. However, the exemplary embodiment is not limited thereto. Depending on the cases, the first capacitor electrode 139 can be formed with a material which is different from that of the semiconductor layers 133 and 136.

A gate insulating layer 140 is formed on the semiconductor layers 133 and 136 and on the first capacitor electrode 139. In detail, the gate insulating layer 140 is formed so as to cover the semiconductors layer 133 and 136 and the first capacitor electrode 139 on the buffer layer 120. The gate insulating layer 140 can be formed to include at least one of various insulating materials known to a skilled person, such as tetra ethyl ortho silicate (TEOS), silicon nitride (SiNx), and silicon oxide ($SiO_2$).

Gate electrodes 153 and 156 and a first electrode 710, formed on the same layer and with the same material as the gate lines (S1 to Sn), are formed on the gate insulating layer 140. The gate electrodes 153 and 156 are formed on the semiconductor layers 133 and 136, respectively, so as to overlap channel regions 1333 and 1366, respectively, of the semiconductor layers 133 and 136, respectively. The semiconductor layers 133 and 136 are classified as impurity-non-doped channel regions 1333 and 1366, respectively, and source regions 1334 and 1367 and drain regions 1335 and 1368 are disposed on both sides of the channel regions 1333 and 1366, respectively, and are doped with an impurity. The gate electrodes 153 and 156 prevent the channel regions 1333 and 1366, respectively, from being doped with an impurity when the source regions 1334 and 1367, respectively, and the drain regions 1335 and 1368, respectively, are doped with an impurity. Also, an impurity can be doped into the first capacitor electrode 139 when the impurity is doped into the source regions 1334 and 1367 and the drain regions 1335 and 1368 of the semiconductor layers 133 and 136, respectively.

Also, the gate electrodes 153 and 156 are formed with a gate transparent layer and a gate metal layer formed on the gate transparent layer. The gate metal layer is formed so as to include at least one of the various metallic materials known to a skilled person, such as molybdenum (Mo), chromium (Cr), aluminum (Al), silver (Ag), titanium (Ti), tantalum (Ta), and tungsten (W). The gate transparent layer includes at least one of the transparent conductive layers, including indium tin oxide (ITO), indium zinc oxide (IZO), zinc indium tin oxide (ZITO), gallium indium tin oxide (GITO), indium oxide ($In_2O_3$), zinc oxide (ZnO), gallium indium zinc oxide (GIZO), gallium zinc oxide (GZO), fluorine tin oxide (FTO), and aluminum-doped zinc oxide (AZO).

The first electrode 710 is formed on the same layer as, and with the same material as, the gate transparent layer of the gate electrodes 153 and 156.

An inorganic insulation layer 160 is formed on the gate electrodes 153 and 156. The inorganic insulation layer 160 includes at least one of a silicon nitride layer and a silicon oxide layer. That is, the inorganic insulation layer 160 is a single layer formed with the silicon nitride layer or the silicon oxide layer, or a double layer stacked with the silicon nitride layer and the silicon oxide layer. Also, the inorganic insulation layer 160 can include hydrogen. Particularly, the silicon nitride layer can easily include hydrogen according to the process conditions. The inorganic insulation layer 160 can support a process for annealing the semiconductor layers 133 and 136 by providing hydrogen to the semiconductor layers 133 and 136 in addition to having the insulation function.

However, the exemplary embodiment is not limited thereto. Therefore, the inorganic insulation layer 160 can be omitted. That is, the first insulation layer 170 to be described can be formed on the gate electrodes 153 and 156.

Furthermore, the inorganic insulation layer 160 is not formed on the first electrode 710. That is, the inorganic insulation layer 160 is formed so as to expose the first electrode 710. A first insulation layer 170 is formed on the inorganic insulation layer 160. It is easy to form the first insulation layer 170 so as to be relatively thicker than the inorganic insulation layer 160. Hence, the first insulation layer 170 can be formed so as to have a substantial thickness and so as to acquire a stable inter-layer insulation. For example, the first insulation layer 170 can be formed to have a thickness of 3 μm (micrometers).

Also, the first insulation layer 170 is not formed on the first electrode 710 in a manner similar to the inorganic insulation layer 160. That is, the first insulation layer 170 is formed so as to reveal the first electrode 710.

A plurality of conductive wires 184, 185, 187, 188 and 189 are formed on the first insulation layer 170, and on the same layer and with the same material as the data lines (D1 to Dm). The conductive wires include source electrodes 184 and 187, drain electrodes 185 and 188, and a second capacitor electrode 189. The conductive wires can further include a data line Dm (shown in FIG. 2) and a common power line Un (shown in FIG. 3).

Also, the conductive wires 184, 185, 187, 188 and 189 can be made to include at least one of various metallic materials known to a skilled person in a manner similar to the gate electrodes 153 and 156.

The source electrodes 184 and 187 and the drain electrodes 185 and 188 contact the source regions 1334 and 1367, respectively, and the drain regions 1335 and 1368, respectively, of the semiconductor layers 133 and 136, respectively, through contact holes formed in the inorganic insulation layer 160 and the first insulation layer 170.

Furthermore, the second capacitor electrode 189 is formed in the same position as the source electrodes 184 and 187 and the drain electrodes 185 and 188, but the exemplary embodiment is not limited thereto. Therefore, the second capacitor electrode 189 can be formed on the same layer as the gate electrodes 153 and 156.

A second insulation layer 190 is formed on the conductive wires 184, 185, 187, 188 and 189. That is, the second insulation layer 190 is provided on the data lines (D1 to Dm). The second insulation layer 190 includes a pixel opening 195 for partially revealing the first electrode 710. The second insulation layer 190 can be formed with various organic materials known to a skilled person. For example, the second insulation layer 190 is patterned to be a photosensitive organic layer, and is formed after being cured by heat or light.

An organic emission layer 720 is formed on the first electrode 710, and the second electrode 730 is formed on the organic emission layer 720. The first electrode 710, the organic emission layer 720, and the second electrode 730 form an organic light emitting element 70. The pixel opening 195 of the second insulation layer 190, on which the first electrode 710, the organic emission layer 720 and the second electrode 730 are sequentially stacked, becomes a light emitting region of the organic light emitting element 70.

Figure 5:
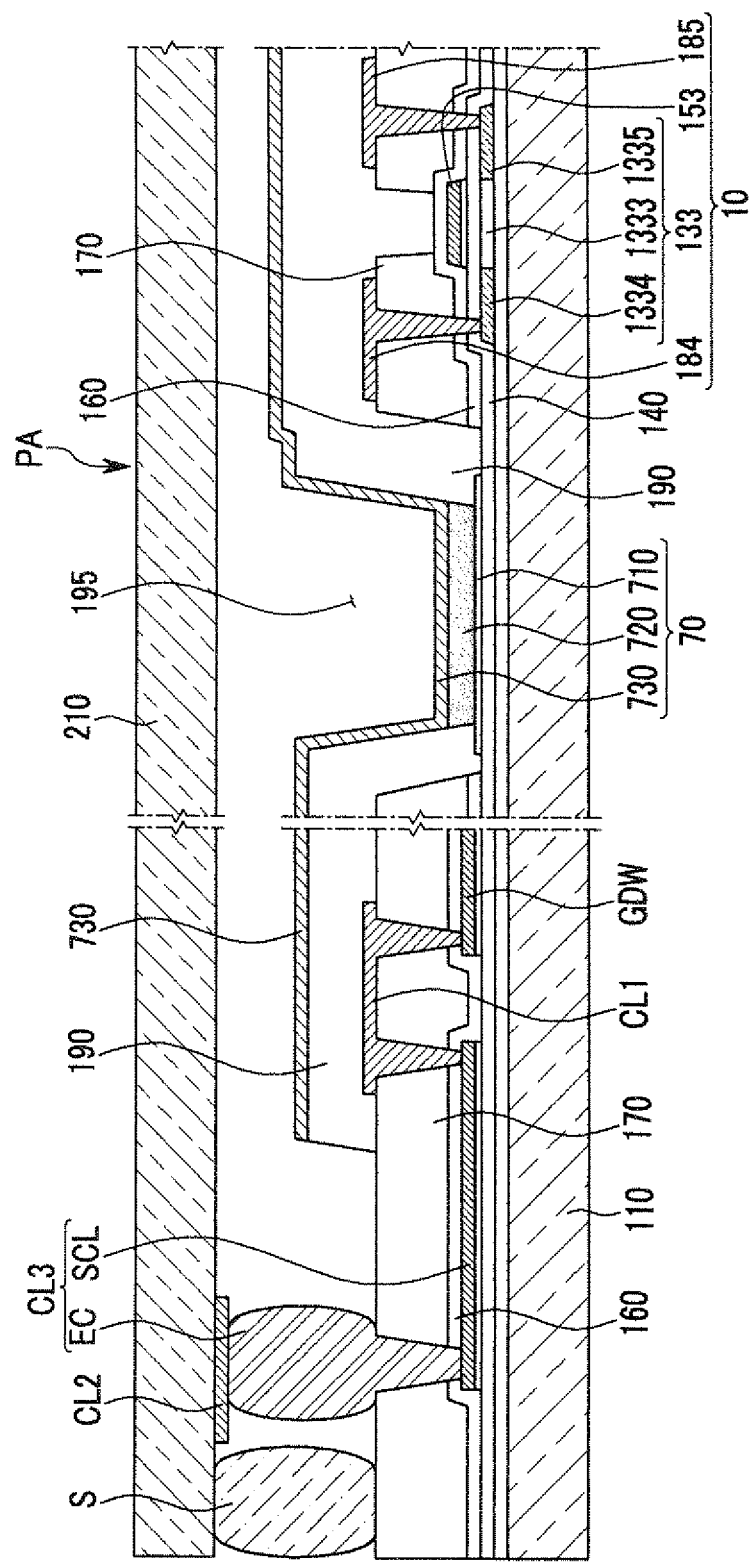
FIG. 5 shows a partially magnified cross-sectional view with respect to a first connecting line, a second connecting line, and a third connecting line shown in FIG. 2.

FIG. 5 shows a partially magnified cross-sectional view with respect to a first connecting line, a second connecting line, and a third connecting line shown in FIG. 2.

Referring to FIG. 5, a stacked state of the first connecting line CL1, the second connecting line CL2, and the third connecting line CL3 will now be described in detail.

The first connecting line CL1 is formed on the first substrate 110, and on the same layer and with the same material as the source electrode 184 and the drain electrode 185. That is, the first connecting line CL1 is formed on the same layer, and with the same material, as the data lines (D1 to Dm). The first connecting line CL1 is connected to a gate driver wire (GDW) for configuring a gate driver (GD), and to a third connecting line CL3 through a contact hole formed on the first insulation layer 170. The first connecting line CL1 overlaps the second electrode 730, a cathode.

A second connecting line CL2 is formed on the second substrate 210 encapsulating the first substrate 110. The second connecting line CL2 is separated from the second electrode 730, is disposed on an outer portion of the panel (PA), and does not overlap with the second electrode 730. The first insulation layer 170 is provided in correspondence with the second connecting line CL2, and the second insulation layer 190 is not provided. That is, the second insulation layer 190 is not provided between the second connecting line CL2 and the first insulation layer 170, and the second connecting line CL2 faces the first insulation layer 170. The reason why the second insulation layer 190 is not provided between the second connecting line CL2 and the first insulation layer 170 is that the second insulation layer 190 is formed with an organic material, and should the second insulation layer 190 instead be provided between the second connecting line CL2 and the first insulation layer 170, the sealing between the second insulation layer 190 and a sealant (S) for bonding and sealing the first substrate 110 and the second substrate 210 is not perfect. Thus, moisture may enter the organic light emitting element 70 from the outside through the second insulation layer 190 below the sealant (S).

The third connecting line CL3 includes a sub-connecting line (SCL) and an access unit (EC).

The sub-connecting line (SCL) is formed on the same layer as, and with the same material as, the gate electrode 153. That is, the sub-connecting line (SCL) of the third connecting line CL3 is formed on the same layer as, and with the same material as, the gate lines (S1 to Sn).

The access unit (EC) connects the second connecting line CL2 to the sub-connecting line (SCL) through a contact hole formed in the first insulation layer 170.

As described, in the organic light emitting diode (OLED) display, the first connecting line CL1, formed on the first substrate 110 and supplying an external clock signal to the gate driver (GD), overlaps with the second electrode 730, a cathode. In addition, the second connecting line CL2, formed on the second substrate 210 and supplying the clock signal to the first connecting line CL1 through the third connecting line CL3, does not overlap with the second electrode 730. Thus, the delay of the clock signal on the first connecting line CL1, which receives the clock signal from a plurality of nodes through the second connecting line CL2, is minimized.

Also, in the organic light emitting diode (OLED) display, the wire for minimizing the delay of the clock signal on the first connecting line CL1 is formed on the second substrate 210 so that no flexible printed circuit (FPC) for additionally providing the clock signal to the first connecting line CL1 is needed. This effectively reduces the production cost of the organic light emitting diode (OLED) display and improves production yield.

Furthermore, in the organic light emitting diode (OLED) display, the second connecting line CL2 is formed as a wire provided on a different layer from the first connecting line CL1 so that the second connecting line CL2 is not revealed on the first substrate 110. Therefore, an undesired short-circuited state of the second connecting line CL2 and the first connecting line CL1 is prevented, and oxidization of the second connecting line CL2 during the manufacturing process is simultaneously prevented.

While this disclosure has been described in connection with what is presently considered to be practical exemplary embodiments, it is to be understood that the invention is not limited to the disclosed embodiments but, on the contrary, is intended to cover various modifications and equivalent arrangements included within the spirit and scope of the appended claims.

What is claimed is:

1. An organic light emitting diode display, comprising:
   a panel including a first substrate and a second substrate facing each other;
   a data driver connected to a data line formed on the panel;
   a gate driver connected to a gate line crossing the data line in an insulated manner and formed on the panel;
   an input line for receiving a clock signal from an external source;
   a first connecting line formed on the first substrate and electrically connected to the input line for supplying the clock signal to the gate driver;
   a second connecting line formed on the second substrate and electrically connected to the input line; and
   a third connecting line for electrically connecting the first connecting line to the second connecting line.

2. The organic light emitting diode display of claim 1, further comprising:
   a first electrode provided on the first substrate;
   an organic emission layer provided on the first electrode; and
   a second electrode provided on the organic emission layer;
   wherein the first connecting line overlaps with the second electrode.

3. The organic light emitting diode display of claim 2, wherein the second connecting line does not overlap with the second electrode.

4. The organic light emitting diode display of claim 2, wherein the gate line includes a gate transparent layer and a gate metal layer formed on the gate transparent layer, and the first electrode is formed on a same layer as, and with a same material as, the gate transparent layer.

5. The organic light emitting diode display of claim 1, wherein the first connecting line is formed on a same layer as, and with a same material as, the data line.

6. The organic light emitting diode display of claim 1, wherein the third connecting line includes:
   a sub-connecting line formed on a same layer as, and with a same material as, the gate line; and
   an access unit for connecting the sub-connecting line to the second connecting line.

7. The organic light emitting diode display of claim 1, wherein the data line is provided on the gate line, and the data line includes:
   a first insulation layer provided on the gate line; and
   a second insulation layer provided on the data line and including an organic material;
   wherein the second connecting line faces the first insulation layer.

8. The organic light emitting diode display of claim 7, wherein the second insulation layer is not provided between the second connecting line and the first insulation layer.

9. The organic light emitting diode display of claim 7, the second connecting line being spaced apart from the second insulating layer.

10. The organic light emitting diode display of claim 1, the second connecting line being arranged directly on the second substrate, the first connecting line being arranged closer to the first substrate than the second substrate.

11. The organic light emitting diode display of claim 1, wherein the second connecting line being arranged closer to the second substrate than the first substrate, and wherein the first connecting line being arranged closer to the first substrate than the second substrate.

12. The organic light emitting diode display of claim 1, wherein each of the first, second and third connecting lines to supply the clock signal from the external source to the gate driver and are external to an image producing portion of the organic light emitting diode display.

13. The organic light emitting diode display of claim 1, wherein each of the first, second and third connecting lines comprises a plurality of lines, and each line of the second connecting line is connected to a same line of the first connecting line a plurality of times at a plurality of locations by a corresponding plurality of lines of the third connecting lines.

14. The organic light emitting diode display of claim 1, wherein the second connecting line is electrically connected to the first connecting line by only a conductive wire.

15. The organic light emitting diode display of claim 1, wherein each of the first, second and third connecting lines are external to an image producing display region of the display.

* * * * *